United States Patent [19]

Blitshteyn et al.

[11] Patent Number: 4,716,371
[45] Date of Patent: Dec. 29, 1987

[54] NON-CONTACT AUTORANGING ELECTROSTATIC FIELDMETER WITH AUTOMATIC DISTANCE INDICATOR

[75] Inventors: Mark Blitshteyn, Edison, N.J.; William S. Wright, Green Lane, Pa.

[73] Assignee: The Simco Company, Inc., Hatfield, Pa.

[21] Appl. No.: 757,652

[22] Filed: Jul. 22, 1985

[51] Int. Cl.<sup>4</sup> .......................... G01R 29/12
[52] U.S. Cl. ........................ 324/457; 324/72
[58] Field of Search ............ 324/72, 457, 458, 72.5

[56] References Cited

U.S. PATENT DOCUMENTS

| | | |
|---|---|---|
| 3,427,540 | 2/1969 | Exworthy . |
| 3,449,668 | 6/1969 | Blackwell et al. . |
| 3,522,531 | 8/1970 | Cohn . |
| 3,525,936 | 8/1970 | Vosteen . |
| 3,715,661 | 2/1973 | Posey et al. . |
| 3,729,675 | 4/1973 | Vosteen . |
| 3,774,108 | 11/1973 | Ogilvie . |
| 4,001,683 | 1/1977 | McNeilly . |
| 4,106,869 | 8/1978 | Buchheit . |
| 4,197,493 | 4/1980 | Juve et al. . |
| 4,321,530 | 3/1982 | Kelly et al. . |
| 4,339,721 | 7/1982 | Nihira et al. . |
| 4,370,616 | 1/1983 | Williams .................. 324/72 X |
| 4,520,318 | 5/1985 | Hascal et al. .............. 324/72 X |
| 4,553,099 | 11/1985 | Kasahara et al. ........... 324/458 |

Primary Examiner—Reinhard J. Eisenzopf
Assistant Examiner—Robert W. Mueller
Attorney, Agent, or Firm—Barnes & Thornburg

[57] ABSTRACT

An instrument for non-contact measurement of electrostatic fields and related parameters, such as electrostatic potential, voltage and charge density of a charged object, includes a sensor for sensing the electrostatic field produced by the object and for producing an electrical signal, a display for producing a visual readout related to the electrical signal and a range scaling circuit for coupling the sensor to the display. The range scaling circuit is coupled to logic which switches the range scaling circuit and the display back and forth between two ranges, one for relatively higher strength field measurements and one for relatively lower strength field measurements. Because the distance at which the instrument is held from the charged object to achieve an accurate reading depends upon the strength of the field, the range scaling circuit is also coupled to circuitry which indicates the appropriate distance from the charged object at which the instrument must be held to provide an accurate measurement.

5 Claims, 5 Drawing Figures

NON-CONTACT AUTORANGING ELECTROSTATIC FIELDMETER WITH AUTOMATIC DISTANCE INDICATOR

This invention relates to apparatus for measuring electrostatic fields and related parameters such as electrostatic potential, voltage and charge density of an object in a non-contact manner, and particularly to non-contact electrostatic fieldmeters.

Non-contact electrostatic fieldmeters for measuring the electrostatic field produced by charged objects are known and are useful, for example, in measuring the charge on objects to be coated with materials dispensed from equipment which electrostatically charges and dispenses the materials. In order to achieve a uniform, high-quality coating, it is necessary that objects being coated be maintained at the same voltage relative to the coating dispensing equipment. Variations in the voltage difference between the coating dispensing equipment and objects to be coated can cause variations in the quality and thickness of the applied coating from object to object.

When a non-contact electrostatic fieldmeter is used to measure the electrostatic field produced by a charged object, it must be held a precise, specified distance from the charged object. The electrostatic field of the charged object induces a charge on the sensing electrode of the fieldmeter. The magnitude of the charge developed on this sensing electrode is proportional to the electric field intensity E at the electrode's surface. The voltage developed on the sensing electrode is also proportional to the distance between the sensing electrode and the charged object. It is therefore necessary to calibrate the fieldmeter at a specified distance from the charged object to be measured and to hold the fieldmeter at this distance from the charged object when a measurement of the charge on the object is taken.

Most non-contact electrostatic fieldmeters can be calibrated to measure a wide range of potentials, typically from 0 to 50 kV, or higher. However, it is impossible to measure such a wide range of voltages at one distance with uniform accuracy. Low voltages should be measured at close distances because the voltage developed by the charged object on the sensing electrode is quite low at long distances. High voltages, on the other hand, should be measured at greater distances due to the possibility of ionization and breakdown of the space between the charged object and grounded components of the electrostatic fieldmeter. Even at such distances some attenuation of the measured electrostatic charge on the object may be necessary. Attenuations in the range of 1:10–1:100 are frequently required. Such attenuations ordinarily cannot be achieved without using some sort of mechanical or electrical signal attenuator.

Existing non-contact electrostatic fieldmeters require the user to perform four tasks in order to make a reasonably accurate measurement. First, the measuring distance must be determined. Second, the user must determine whether attenuation is required. Third, a reading must be taken. Fourth, correction factors must be applied if necessary. Since this sequence must be performed for each measurement, the probability is increased that errors will be introduced into the measurements.

It is an object of this invention to provide an apparatus for measuring electrostatic fields and related parameters such as electrostatic potential, voltage and charge density of an object in a non-contact manner. The apparatus has an automatic measuring distance indicating circuit which includes an indicator display for providing a visual indication to the user of the distance at which a measurement must be taken and means for automatically switching ranges to provide a readout of the direct potential of the object being measured. With such an apparatus, two of the four steps heretofore necessary to take a measurement with non-contact electrostatic fieldmeters have been eliminated. This invention requires the user to take only two steps to make a measurement. First, the meter must be placed the distance from the charged object indicated by the distance indicators. Second, a direct reading is taken. This not only significantly reduces the possibility of erroneous measurements, but also speeds up the measurement process.

According to this invention, a non-contact electrostatic fieldmeter for measuring an electrostatic field produced by a charged object includes means for measuring the electrostatic field. The means for measuring the electrostatic field includes means providing a higher range for measuring higher potential electrostatic fields at longer distances from the object and a lower range for measuring lower potential electrostatic fields at distances nearer to the object. The fieldmeter also includes means for comparing the measured electrostatic field to a pre-determined reference level and for selecting between the higher and lower ranges based upon the comparison. The fieldmeter also includes means for indicating to the user the proper distance to hold the meter sensing electrode from the charged object in response to the range selected.

Additional features and advantages of the invention will become apparent to those skilled in the art upon consideration of the following detailed description of a preferred embodiment exemplifying the best mode of carrying out the invention as presently perceived. The detailed description particularly refers to the accompanying figures in which:

Figures 1, 2:
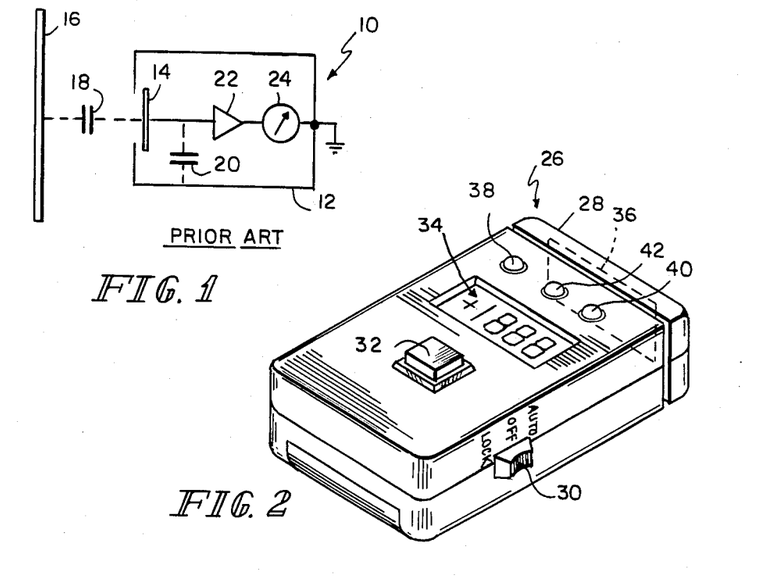
FIG. 1 illustrates a partly block and partly schematic diagram of a circuit for a prior art non-contact electrostatic fieldmeter.
FIG. 2 illustrates a perspective view of a non-contact electrostatic fieldmeter according to this invention.

A simplified diagram of a circuit for a prior art non-contact electrostatic fieldmeter is shown in FIG. 1. The prior art fieldmeter 10 has a conductive enclosure 12 which is usually maintained at ground potential with a sensing electrode 14 mounted on an insulator (not shown) within the enclosure 12. The fieldmeter 10 is used to measure the voltage on a charged object 16. There is a capacitance, illustrated by capacitor 18, between charged object 16 and sensing electrode 14. There is also a capacitance, illustrated by capacitor 20, between sensing electrode 14 and enclosure 12. This capacitance remains constant in fieldmeter 10.

Sensing electrode 14 is coupled to an input terminal of an amplifier 22. An output terminal of amplifier 22 is coupled to one terminal of a meter 24. The other terminal of meter 24 is illustratively coupled to the fieldmeter case 12 ground. Meter 24 provides a visual readout of the measured electrostatic voltage on charged object 16.

The electrostatic field of charged object 16 induces a charge on sensing electrode 14. The charge density $\sigma$ developed on sensing electrode 14 is proportional to the electrical field intensity E at the surface of sensing electrode 14 by the relationship $$\sigma = \epsilon_0 E.$$

The voltage, $V_2$, developed on sensing electrode 14 will be $$V_2 = (\epsilon_0 E A)/C_2$$

where A is the area of sensing electrode 14, $\epsilon_0$ is the permittivity of free space ($8.855 \times 10^{-12}$ farad/meter), and $C_2$ is the capacitance between sensing electrode 14 and the grounded enclosure, illustrated by capacitor 20 in FIG. 1. The electrode area A of sensing electrode 14 and the capacitance 20 between sensing electrode 14 and the enclosure are constant for a given non-contact electrostatic fieldmeter 10.

Fieldmeter 10 measures the voltage $V_2$ which is proportional to the voltage and charge on charged object 16. Fieldmeter 10 can be calibrated to display the actual electrostatic potential of charged object 16.

Most non-contact electrostatic fieldmeters can be calibrated to measure potentials over a wide range, typically from 0 to 50 kV, or higher. However, fieldmeter 10 cannot be held the same distance from charged object 16 and be used to measure the voltage on charged object 16 over this entire range and maintain uniform accuracy. A low voltage on charged object 16 must be measured at relatively close distances from charged object 16 as the voltage developed on sensing electrode 14 would be very low at relatively longer distances from charged object 16. On the other hand, a high voltage on charged object 16 must be measured at relatively greater distance from object 16 because of the possibility of ionization and breakdown of the atmosphere in the space between grounded metal enclosure 12 of fieldmeter 10 and charged object 16. Even at such great distances, some attenuation of the measured electrostatic charge on object 16 may be necessary. Attenuations in the range of 1:10–1:100 may be required. Such attenuations ordinarily cannot be achieved without using some type of mechanical or electrical signal attenuator.

Refering to FIG. 2, a non-contact electrostatic fieldmeter 26 according to this invention is illustrated. Fieldmeter 26 includes a conductive case 28 having an on-off switch 30 mounted on it. Switch 30 illustratively has three positions, AUTO, OFF, and LOCK. Case 28 also includes a READ push button switch 32 mounted on the top surface of case 28 for easy access. A digital display is also mounted to the top surface of case 28 and is used to display the measured electrostatic potential of a charged object. A sensing electrode 36, illustrated in broken lines, is mounted on the front side of case 28. Light emitting diodes (LED's) 38, 40, 42 are mounted on the top surface of case 28 generally toward the front. Illustratively, LED 38 is used to indicate that the voltage on a charged object is in a lower range and that fieldmeter 26 should be held a shorter distance, e.g., one inch, from a charged object 16 to obtain an accurate reading. LED 40 is illustratively used to indicate that the voltage on a charged object is in a higher range and that the fieldmeter 26 should be held a longer distance, e.g., four inches, from a charged object 16. LED 42 is illustratively used to indicate an out-of-range condition.

When READ switch 32 is not depressed, sensing electrode 36 is connected to case 28 which is maintained at ground. When ON/OFF switch 30 is put in the automatic position and fieldmeter 26 is zeroed by exposing it to a region generally free of electrostatic fields with the READ button 32 depressed, LED 38 will indicate that fieldmeter 26 is in the low range and should be held at the shorter distance from a charged object, e.g., one inch.

The fieldmeter 26 is then placed the requisite distance from the charged object and the surface potential on the charged object is read from the display 34. Assuming that the display indicates a charge on the charged object 16 of below 10 kV, the short-range LED distance indicator 38 will stay on and digital display 34 will display a direct readout of the detected potential of object 16. If the surface potential on the charged object is indicated on display 34 to be over 10 kV, fieldmeter 26 automatically switches to the 50 kV range. The longer range indicator LED 40 comes on and an audible alarm sounds, warning the user to increase the distance between fieldmeter 26 and the charged object to. for example, four inches. If the potential on object 16 decreases to a value lower than 10 kV during the measurement at the four inch distance, fieldmeter 26 switches back to the one inch distance range.

The switch 30 is placed in the LOCK position when it is desired to monitor a varying electrostatic field, such as the field created by an electrostatically charged plastic web moving past sensing electrode 36 at high speed. Once switch 30 is placed in the LOCK position, fieldmeter 26 is forced into the 50 kV range and will not switch back and forth between the high and low ranges as the strength of the electrostatic field produced by the charged object varies.

Figure 3:
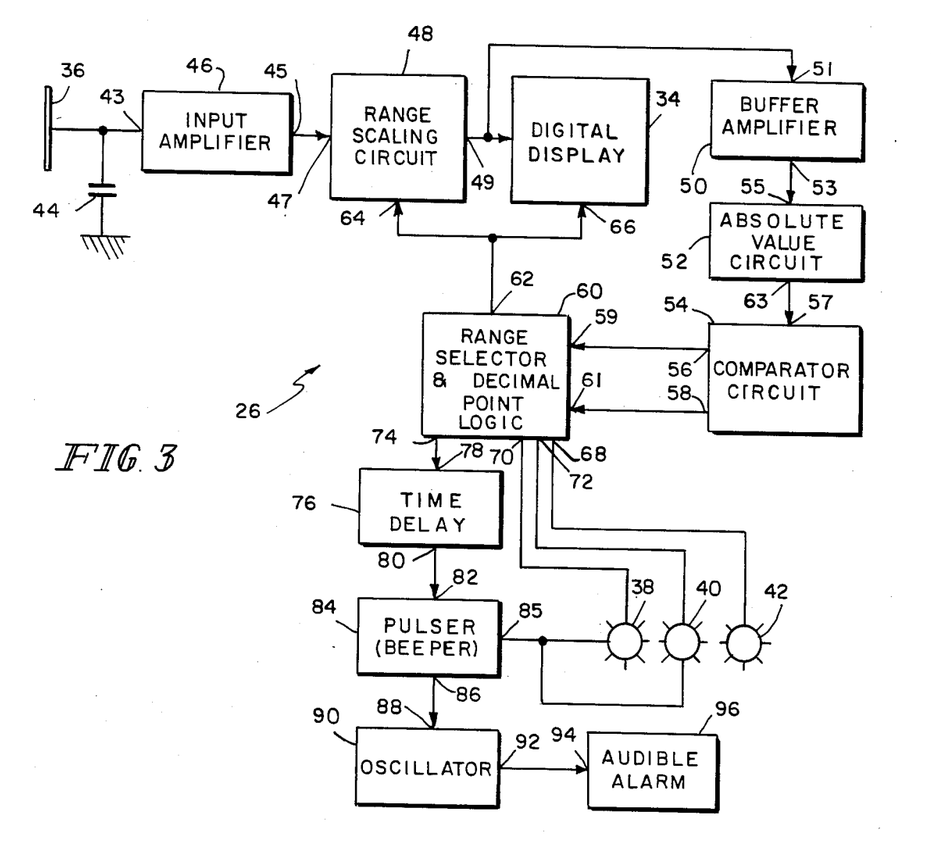
FIG. 3 illustrates a block diagram of a circuit for a non-contact electrostatic fieldmeter according to this invention.

Referring to FIG. 3, a block diagram of a circuit for electrostatic fieldmeter 26 is illustrated. The reference numerals used in FIG. 2 are used where appropriate in FIG. 3 to refer to the same elements. Sensing electrode 36 is coupled to an input terminal 43 of an input amplifier 46 and to one terminal of a capacitor 44. The other terminal of capacitor 44 is coupled to grounded enclosure.

An output terminal 45 of input amplifier 46 is coupled to a signal input terminal 47 of a range scaling circuit 48. A signal output terminal 49 of range scaling circuit 48 is coupled to an input terminal 51 of a buffer amplifier 50 and to an input terminal of digital display 34.

An output terminal 53 of buffer amplifier 50 is coupled to an input terminal 55 of an absolute value circuit 52. An output terminal 63 of absolute value circuit 52 is coupled to an input terminal 57 of a comparator circuit 54. An over-range output terminal 56 of comparator circuit 54 is coupled to an over-range input terminal 59 of range selector and decimal point logic 60. An under-range output terminal 58 of comparator circuit 54 is coupled to an under-range input terminal 61 of range selector and decimal point logic 60. An output terminal 62 of range selector and decimal point logic 60 is coupled to a control input terminal 64 of range-scaling circuit 48 and to a control input terminal 66 of digital display 34.

An output terminal 74 of range selector and decimal point logic 60 is coupled to an input terminal 78 of a time-delay circuit 76. An output terminal 80 of time-delay circuit 76 is coupled to an input terminal 82 of a pulser (beeper) circuit 84. An output terminal 86 of pulser (beeper) circuit 84 is coupled to an input terminal 88 of an oscillator 90. An output terminal 92 of oscillator 90 is coupled to an input terminal 94 of audible alarm 96. An output terminal 85 of pulser (beeper) circuit 84 is coupled to short range LED 38 and to long range LED 40. An output terminal 68 of range selector and decimal point logic 60 is coupled to overrange LED 42. An output terminal 70 of range selector and decimal point logic 60 is coupled to short range LED 38. An output terminal 72 of range selector and decimal point logic 60 is coupled to long range LED 40.

In operation, the electrostatic field produced by the charged object whose charge is to be measured (not shown) induces a charge on sensing electrode 36. The charge density $\sigma$ developed on sensing electrode 36 is proportional to the electric field intensity E at the electrode's surface as described previously and the voltage $V_2$ developed on sensing electrode 36 will be equal to $$V_2=(\epsilon_0 EA)/C_2$$

as discussed previously.

Capacitor 44 acts to reduce the drift caused, for example, by leakage current. The voltage developed on sensing electrode 36 is amplified in input amplifier 46 and supplied to range-scaling circuit 48. Range-scaling circuit 48 illustratively comprises a resistor network which is controlled by range selector and decimal point logic 60. Range-scaling circuit 48 scales the signal from input amplifier 46 and provides the scaled signal to buffer amplifier 50 and to digital display 34. Digital display 34 displays a digital value indicative of the scaled signal which is representative of the electrostatic charge on the charged object.

From buffer amplifier 50, the signal is processed by absolute value circuit 52 in order to provide only positive signals at output terminal 63. The output signal from absolute value circuit 52 is compared to preset values by comparator circuit 54. Comparator circuit 54 illustratively comprises two comparators which detect over-range and under-range signals, respectively. Upon detection of an over-range signal, comparator circuit 54 generates a signal on over-range output terminal 56 which is coupled to over-range input terminal 59 of range selector and decimal point logic 60. Upon detection of an under-range signal, comparator circuit 54 generates an output at its under-range output terminal 58 which is coupled to under-range input terminal 61 of range-selector and decimal point logic 60.

Range-selector and decimal point logic 60 reacts to the presence or absence of over-range and under-range signals from comparator circuit 54 and controls range-scaling circuit 48 and the decimal point on digital display 34. Range-selector and decimal point logic 60 also operates over-range LED 42, short range LED 38, and long range LED 40.

Output terminal 74 of range selector and decimal point logic 60 is used to energize time-delay circuit 76 which, in turn, operates pulser (beeper) circuit 84, which in turn, operates oscillator 90 to drive audible alarm 96 for a predetermined time. Illustratively, audible alarm 96 sounds for approximately five seconds each time voltmeter 26 changes range. This alerts the operator to move fieldmeter 26 to the indicated distance. The appropriate distance LED 38, 40 also flashes during this time period.

Figure 4A:
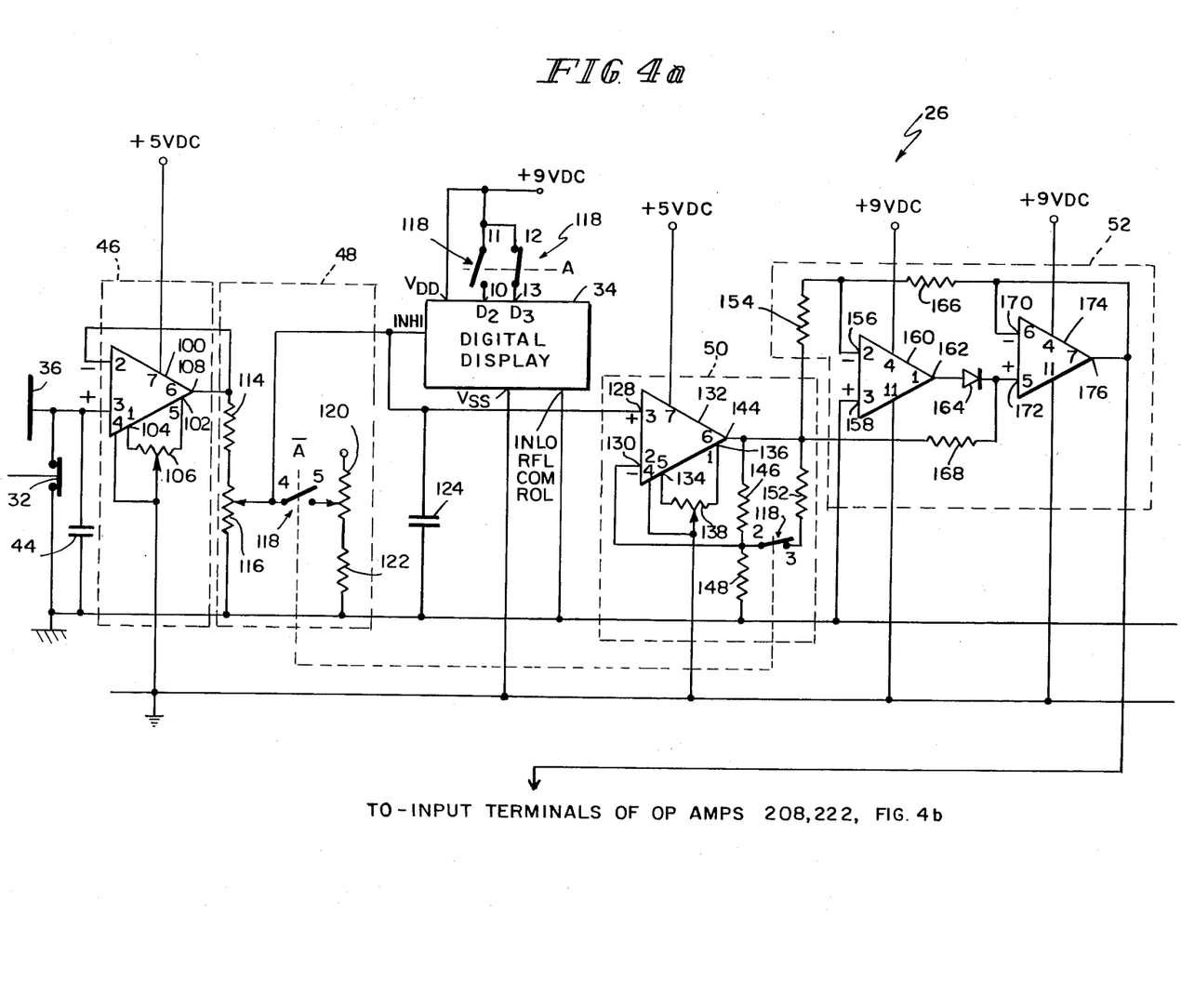
FIGS. 4a-b together illustrate a partly block and partly schematic diagram of a circuit for a non-contact electrostatic fieldmeter according to this invention.
Figure 4B:
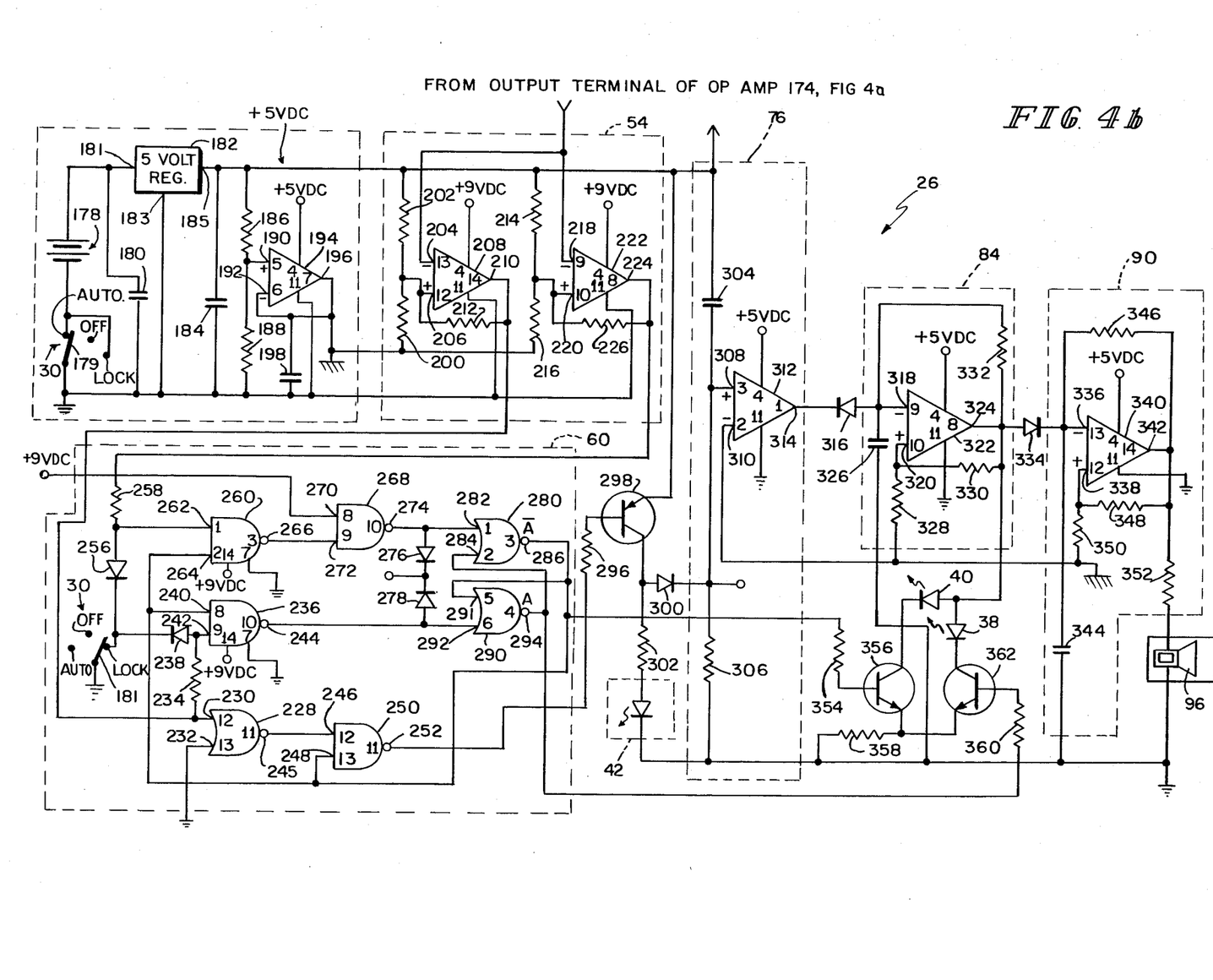

Referring to FIGS. 4 a-b, a more detailed partly block and partly schematic diagram of a circuit for the non-contact electrostatic fieldmeter 26 of this invention is illustrated. The reference numerals used in FIGS. 2 and 3 will be used in FIGS. 4 a-b to identify the same elements. Sensing electrode 36 is connected to one terminal of READ switch 32, to one terminal of a 1000 pF, 5% capacitor 44, and to a non-inverting (+) input terminal of an operational amplifier (op amp) 100. Illustratively, op amp 100 is a type CA3420AE op amp available from RCA. The pin numbers in the following description assume the noted illustrative devices are used, although other devices are equally applicable to this circuit. Op amp 100 is configured as a voltage follower and comprises input amplifier 46. An offset null input 102 (pin 5) of op amp 100 is connected to an offset null output 104 (pin 1) of op amp 100 through a 10K potentiometer 106. The wiper of potentiometer 106 is connected to a system common terminal. An inverting (−) input terminal (pin 2) of op amp 100 is connected to an output terminal 108 (pin 6) of op amp 100.

Output terminal 108 of op amp 100 is connected through a 200K resistor 114 to one terminal of a 50K potentiometer 116. The other terminal of potentiometer 116 is connected to enclosure which is maintained at ground potential and hereinafter will be referred to as ground. The wiper of potentiometer 116 is coupled to one terminal (pin 4) of a normally closed CMOS analog switch 118, the closed condition of which is illustrated in FIGS. 4 a-b as e,ovs/A/ . Illustratively, switch 118 is a type HI3-303-5 dual SPDT switch available from Harris Semiconductor. The portion of the circuit which generates $\overline{A}$ will be discussed in detail later. Pin 5 of switch 118 is connected to a wiper of a 10K potentiometer 120. One terminal of potentiometer 120 is left floating while its other terminal is connected through a 3.9K resistor 122 to ground. Resistors 114, 122, potentiometers 116, 120 and switch 118 illustratively comprise the range scaling circuit 48 of FIG. 3.

When fieldmeter 26 is operating in the 50 kV range, $\overline{A}$ will be true (high or "1") which closes normally open pins 4 and 5 of switch 118. When fieldmeter 26 is operating in the 10 kV range, $\overline{A}$ will be false (low or "038 ) which opens normally open pins 4 and 5 of switch 118. In this manner, the input voltage signal generated at sensing electrode 36 and amplified by input amplifier 46 is appropriately scaled by range scaling circuit 48 for the range in which fieldmeter 26 is operating.

The wiper of potentiometer 116 is also coupled to an input terminal INHI of a digital meter 34. Digital meter 34 illustratively is a type available from Printed Circuits International, 700 East Maple Road, Suite 206, Birmingham, Mich. 48011. A decimal point input terminal D2 of digital meter 34 is connected to pin 10 of switch 118. Pin 11 of switch 118 is connected to a source of +5 VDC. Pins 10 and 11 are normally open contacts of switch 118. A decimal point input terminal, pin D3, of digital meter 34 is coupled to pin 13 of switch 118. Pin 12 of switch 118 is coupled to the source of +5 VDC. Pins 12, 13 are normally closed contacts of switch 118 and are controlled by a logic signal A which is generated by a portion of the circuit which will be discussed in detail later.

When A is true (high or "1"), fieldmeter 26 is in the 10 kV range and the normally closed contacts, pins 12, 13, of switch 118 are open and the normally open contacts, pins 10, 11, of switch 118 are closed, which causes the decimal point of digital meter 34 to be displayed after a particular specified digit. When A is false (low "0"), fieldmeter 26 is in the 50 kV range and the normally open contacts, pins 10, 11, of switch 118 are open and the normally closed contacts, pins 12, 13, of switch 118 are closed, causing the decimal point of digital meter 34 to be displayed after a different predetermined digit. The $V_{DD}$ terminal of meter 34 is coupled to +9 VDC. The $V_{SS}$ terminal of meter 34 is coupled to common. The INLO, RFL, COM and ROL terminals of meter 34 are all coupled to ground.

The wiper of potentiometer 116 is also coupled to one terminal of a 2.2 μF filter capacitor 124 and to a + input terminal 128 (pin 3) of an op amp 132, which illustratively is a type CA3420AE op amp. The other terminal of capacitor 124 is connected to ground.

Op amp 132 and its associated circuitry comprise buffer amplifier 50. The − input terminal 130 (pin 2) of op amp 132 is coupled to pin 2 of switch 118. Pin 3 of switch 118 is coupled through a 287K 1% resistor 152 to an output terminal 144 (pin 6) of op amp 132. − input terminal 130 (pin 2) of op amp 132 is also coupled to ground through an 11.3K 1% resistor 148 and to output terminal 144 (pin 6) of op amp 132 through a 374K 1% resistor 146. An offset null input terminal 134 (pin 5) of op amp 132 is connected through a 10K potentiometer 138 to an offset null output terminal 136 (pin 1) of op amp 132. The wiper of potentiometer 138 is connected to system common and to pin 4 of op amp 132.

Op amp 132 is configured as a non-inverting amplifier. When fieldmeter 26 is operating in the 50 kV range, $\overline{A}$ will be true (high or "1") so that switch 118 will be energized, opening normally closed contacts, pins 2, 3. When fieldmeter 26 is operating in the 10 kV range, $\overline{A}$ will be false (low or "0") which de-energizes switch 118, closing normally closed contacts, pins 2, 3. In this manner, the input voltage signal generated at sensing electrode 36 and amplified by input amplifier 46 is appropriately conditioned by buffer amplifier 50 for subsequent use. The remaining pins (not shown) of switch 118 are connected as follows: pin 1, not connected; pin 6, connected to $\overline{A}$; pin 7, connected to ground; pin 8, connected to common; pin 9, connected to A; and pin 14, connected to +9 VDC.

The output terminal 144 of op amp 132 is connected through a 20K resistor 168 to the cathode of a diode 164, to a+input terminal 172 (pin 5) of an op amp 174, and through a 10K 1% resistor 154 to a − input terminal 156 (pin 2) of an op amp 160. The+input terminal 158 (pin 3) of op amp 160 is connected to ground. The − input terminal 156 (pin 2) of op amp 160 is coupled through a 10K 1% resistor 166 to the − input terminal 170 (pin 6) of op amp 174 and to the output terminal 176 (pin 7) of op amp 174. The output terminal 162 (pin 1) of op amp 160 is coupled to the anode of diode 164, which illustratively is a 1N914 diode. Op amps 160 and 174, with their associated components, comprise absolute value circuit 52. Op amps 160, 174 are illustratively each one-fourth of a type LM324AN integrated circuit manufactured by National Semiconductor Corp., 2900 Semiconductor Drive, Santa Clara, Calif. 95051.

The output signal generated at terminal 144 of op amp 132 is inverted by op amp 160, which is configured as a unity gain inverter, and applied to the anode of diode 164. Therefore, when the output of op amp 132 is positive, the output signal at terminal 162 of op amp 160 is negative and diode 164 will not pass it. However, since the signal at output terminal 144 of op amp 132 is coupled to the + input terminal 172 of op amp 174 through resistor 168, op amp 174, which is configured as a unity gain amplifier, generates a signal at output terminal 176 which is equal in amplitude to the signal at output terminal 144 of op amp 132. When the output of op amp 132 is negative, it is inverted by unity gain op amp 160 and passes through diode 164 to the + input terminal 172 of op amp 174. Consequently, a positive voltage of equal magnitude to the voltage at output terminal 144 of op amp 132 is provided at output terminal 176 of op amp 174.

Referring now to FIG. 4b, a positive terminal of a battery 178, which is illustratively a 9 VDC battery, is coupled to an input terminal of a 5 volt regulator 182 and to one terminal of a 0.33 μF capacitor 180. 5 volt regulator 182 is a type available from Fairchild Semiconductor. The other terminal of capacitor 180 is coupled to system common. The negative terminal of battery 178 is coupled to the AUTO and LOCK contacts of switch 30. The common contact of switch 30 is coupled to system common. A terminal 183 of 5 volt regulator 182 is coupled to system common. Regulated 5 VDC is at an output terminal 185 of 5 volt regulator 182. Output terminal 185 is coupled to one terminal of a 0.1 μF capacitor 184, through a 10K 1% resistor 186 to the + input terminal 190 (pin 5) of an op amp 194, through an 11K 1% resistor 202 to a + input terminal 206 (pin 12) of an op amp 208, through a 93.1K 1% resistor 214 to a + input terminal 220 (pin 10) of an op amp 222, and to one terminal of a 4.7 μF capacitor 304. The other terminal of capacitor 184 is coupled to system common.

The + input terminal 190 (pin 5) of op amp 194 is coupled through a 10K 1% resistor 188 to system common. The − input terminal 192 (pin 6) and the output terminal 196 (pin 7) of op amp 194 are coupled to one terminal of a 33 μF 35 VDC capacitor 198 and to ground. The other terminal of capacitor 198 is connected to system common. The output terminal 196 of op amp 194 is connected through a 31.6K 1% resistor 200 to + input terminal 206 (pin 12) of op amp 208 and through an 11.3K 1% resistor 216 to+input terminal 220 (pin 10) of op amp 222.

The + input terminal 206 (pin 12) of op amp 208 is coupled through a 10M resistor 212 to the output terminal 210 (pin 14) of op amp 208. The − input terminal 204 (pin 13) of op amp 208 is coupled to output terminal 176 of op amp 174 (FIG. 4a). The output terminal 210 of op amp 208 is coupled to an input terminal 230 of a NOR gate 228. NOR gate 228 illustratively is one fourth of a type MC14001B integrated circuit. Each of op amps 194, 208, 222 is illustratively one-fourth of a type LM324AN integrated circuit.

The + input terminal 220 (pin 10) of op amp 222 is coupled through a 10M resistor 226 to the output terminal 224 (pin 8) of op amp 222. The − input terminal 218 (pin 9) of op amp 222 is coupled to output terminal 176 (pin 7) of op amp 174. Output terminal 224 (pin 8) of op amp 222 is coupled through a 100K resistor 258 to an input terminal 262 of a NAND gate 260 and to the anode of a diode 256, illustratively a type 1N914 diode.

Op amps 208, 222 comprise comparator circuit 54. Output terminal 210 (pin14) of op amp 208 forms over-range output terminal 56 (FIG. 3) of comparator circuit 54 and output terminal 224 (pin 8) of op amp 222 forms under-range output terminal 58 (FIG. 3) of comparator circuit 54. When the level of the signal from output terminal 176 (pin 7) of op amp 174 exceeds the level of the signal at + input terminal 206 (pin 12) of op amp 208, which is set by voltage divider resistors 200, 202, the output terminal 210 (pin 14) of op amp 208 will go low, indicating that an over-range condition exists. Otherwise, the output terminal 210 (pin 14) of op amp 208 is high. When the level of the signal from output terminal 176 (pin 7) of op amp 174 is less than the level of the signal at + input terminal 220 (pin 5) of op amp 222, which is set by voltage divider resistors 214, 216 output terminal 224 (pin 7) of op amp 222 is high, indicating that an under-range condition exists. Otherwise it is low.

The cathode of diode 256 is coupled to one terminal of switch 30 and the other terminal 181 of switch 30 is connected to system common. The cathode of diode 256 is also coupled to the cathode of a diode 238. The anode of diode 238 is coupled to an input terminal 242 of a NOR gate 236 and through a 100K resistor 234 to an input terminal 230 of NOR gate 228. An input terminal 232 of NOR gate 228 is coupled to system common. An output terminal 245 of NOR gate 228 is coupled to an input terminal 246 of a NAND gate 250.

An output terminal 266 of NAND gate 260 is coupled to an input terminal 272 of a NAND gate 268. An input terminal 270 of NAND gate 268 is coupled to a source of +9 VDC, illustratively battery 178.

An output terminal 274 of NAND gate 268 is coupled to an input terminal 282 of a NOR gate 280 and to the anode of a diode 276. The cathode of diode 276 is connected to the cathode of a diode 278. The anode of diode 278 is coupled to an output terminal 244 of NOR gate 236 and to an input terminal 292 of a NOR gate 290. An output terminal 286 of NOR gate 280 is coupled to an input terminal 291 of NOR gate 290. An output terminal 294 of NOR gate 290 is coupled to an input terminal 284 of NOR gate 280. NOR gates 280, 290 are configured as an S-R flip-flop. Illustratively each of NAND gates 250, 260, 268 is one fourth of a type MC14011B integrated circuit available from Motorola, and each of NOR gates 228, 236, 280 and 290 is one fourth of a type MC 14001B integrated circuit available from the same source. Illustratively, each of diodes 276, 278 is a type 1N914 diode.

Output terminal 286 of NOR gate 280 is coupled to an input terminal 248 of NAND gate 250, to an input terminal 240 of NOR gate 236 and to an input terminal 264 of NAND gate 260. Illustratively, NAND gates 250, 260, 268 and NOR gates 228, 236, 280, 290 comprise range-selector and decimal point logic circuit 60. The logic signal $\overline{A}$ is generated at output terminal 286 of NOR gate 280 and the logic signal A is generated at output terminal 294 of NOR gate 290.

Output terminal 286 of NOR gate 280 is also coupled through a 100K resistor 354 to the base of a transistor 356. The collector of transistor 356 is coupled to the cathode of long range indicator LED 40 and the anode of LED 40 is coupled to an output terminal 324 (pin 8) of an op amp 322, such as one fourth of a type LM 324AN integrated circuit. The emitter of transistor 356 is coupled through a 750 ohm resistor 358 to system common.

Output terminal 294 of NOR gate 290 is coupled through a 100K resistor 360 to the base of a transistor 362. The collector of transistor 362 is coupled to the cathode of short range indicator LED 38. The anode of short range indicator LED 38 is coupled to output terminal 324 (pin 8) of op amp 322. The emitter of transistor 362 is coupled to the emitter of transistor 356. Illustratively, transistors 356, 362 are type MPS 2222 transistors available from Motorola.

An output terminal 252 of NAND gate 250 is coupled through a 100K resistor 296 to the base of a transistor 298. The emitter of transistor 298 is coupled to output terminal 185 of 5 VDC regulator 182. The collector of transistor 298 is coupled to the anode of a diode 300 and through a 750 ohm resistor 302 to the anode of over-range LED 42. The cathode of over-range LED 42 is coupled to system common. The cathode of diode 300 is coupled to the junction of the cathodes of diodes 276, 278, to the + input terminal 308 (pin 3) of an op amp 312, to the remaining terminal of capacitor 304, and through an 820K resistor 306 to system common. Transistor 298 illustratively is a type MPS 2907 transistor available from Motorola.

A — input terminal 310 (pin 2) of op amp 312 is coupled to ground. An output terminal 314 (pin 1) of op amp 312 is coupled to the cathode of a diode 316. The anode of diode 316 is coupled to a — input terminal 318 (pin 9) of op amp 322. Op amp 312 and its associated circuitry comprise time-delay circuit 76. Op amp 312 is illustratively one fourth of a type LM324AN integrated circuit.

The — input terminal 318 (pin 9) of op amp 322 is coupled through a 0.47uf capacitor 326 to system common and through a 100K resistor 332 to the output terminal 324 (pin 8) of op amp 322. The + input terminal 320 (pin 10) of op amp 322 is coupled through a 100K resistor 330 to its output terminal 324 (pin 8) and through a 100K resistor 328 to ground. Op amp 322 and its associated components comprise pulser (beeper) circuit 84.

Output terminal 324 of op amp 322 is connected to the anode of a diode 334. The cathode of diode 334 is coupled to a — input terminal 336 (pin 13) of an op amp 340, through a 0.01 $\mu$f capacitor 344 to system common, and through a 12K resistor 346 to the output terminal 342 (pin 14) of op amp 340. Output terminal 342 (pin 14) of op amp 340 is coupled through a 150 ohm $\frac{1}{4}$ W resistor 352 to one terminal of audible alarm 96. The other terminal of audible alarm 96 is connected to system common. The + input terminal 338 (pin 12) of op amp 340 is coupled through a 100K resistor 348 to output terminal 342 (pin 14) of op amp 340 and through a 100K resistor 350 to ground. Op amp 340 and its associated circuitry comprise oscillator 90. Op amp 340 is illustratively one fourth of a type LM324AN integrated circuit.

In operation, when READ switch 32 is pushed, which occurs when a measurement is to be taken, sensing electrode 36 is ungrounded and a voltage develops on it which is proportional to the potential on the charged object. This voltage is amplified by input amplifier 46 and is displayed by digital display 34 after being scaled by range scaling circuit 48. The switch between pins 4 and 5 of switch 118 controls the range of fieldmeter 26 as will be discussed later. The switches between pins 10, 11 and 12, 13 of switch 118 control where the decimal point will appear on digital meter 34.

Buffer amplifier 50 amplifies the signal generated at the output of input amplifier 46 (output terminal 108 of op amp 100) after the signal is scaled by range scaling circuit 48. This amplified signal from buffer amplifier 50 is provided to absolute value circuit 52. Absolute value circuit 52 provides a positive voltage at its output (output terminal 176 of op amp 174) which is the same magnitude as the voltage signal produced at the output of buffer amplifier 50 (output terminal 144 of op amp 132) and is positive. The output of absolute value circuit 52 is monitored by op amps 208, 222, which comprise comparator circuit 54 and provide over-range and under-range signals, respectively, as discussed.

Range select and decimal point logic 60 responds to the over-range and under-range signals and sets the range of voltmeter 26 accordingly. When voltmeter 26 is in the 50 kV range, output terminal 286 of NOR gate 280 is true or high and output terminal 294 of NOR gate 290 is false or low. The $\overline{A}$ signal therefore is high or true and the A signal is low or false.

If an over-range signal is then generated by op amp 208, the "0" or low signal generated at output terminal 210 (pin 14) of op amp 208 causes the output terminal 245 of NOR gate 228 to go high. Since the voltmeter is in the 50 kV range, the output terminal 286 of NOR gate 280 is high, so that input terminal 248 of NAND gate 250 is high. Therefore, when output terminal 245 of NOR gate 228 goes high, output terminal 252 of NAND gate 250 goes low. This pulls the base of transistor 298 low, turning on over-range LED 42.

Input terminal 242 of NOR gate 236 is also pulled low by the over-range signal from output terminal 210 of op amp 208. Input terminal 240 of NOR gate 236 is high due to the fact that fieldmeter 26 is in the 50 kV range. Therefore, the output terminal 244 of NOR gate 236 remains low. Fieldmeter 26 therefore remains in the 50 kV range.

Assuming again that fieldmeter 26 is in the 50 kV range, output terminal 286 of NOR gate 280 is high, which pulls input terminal 248 of NAND gate 250, input terminal 240 of NOR gate 236, and input terminal 264 of NAND gate 260 high. When an under-range signal is generated by op amp 222, output terminal 224 of op amp 222 goes high. This pulls input terminal 262 of NAND gate 260 high, assuming that switch 30 is in the AUTO position. Therefore, output terminal 266 of NAND gate 260 goes low. Since input terminal 270 of NAND gate 268 is tied to a 9 VDC line, the transition of output terminal 266 from high to low causes output 274 of NAND gate 268 to go from low to high. This causes input terminal 282 of NOR gate 280 to go high which causes output terminal 286 of NOR gate 280 to go low. The flip-flop formed by NOR gates 280, 290 therefore changes state. Output terminal 286 of NOR gate 280 goes low and output terminal 294 of NOR gate 290 goes high, causing $\overline{A}$ to be false or low and A to be true or high. This causes pins 4, 5 of switch 118 to open and pins 2, 3 of switch 118 to close, switching fieldmeter 26 into the 10 kV range. Pins 12, 13 of switch 118 open and pins 10, 11 of switch 118 close, changing the position of the decimal point on digital display 34. The high output terminal 294 of NOR gate 290 also biases transistor 362 on, thereby illuminating short range indicator LED 38. The low output terminal 286 of NOR gate 280 biases transistor 356 off, turning long range indicator LED 40 off.

Assuming that fieldmeter 26 is in the 10 kV range, output terminal 286 of NOR gate 280 is low, causing input terminal 248 of NAND gate 250, input terminal 240 of NOR gate 236, and input terminal 264 of NAND gate 260 to be low. When op amp 208 generates an over-range signal due to an increased signal level from output terminal 176 of op amp 174, output terminal 210 of op amp 208 is low. Since an under-range condition does not exist, output terminal 224 of op amp 222 is high.

When output terminal 210 of op amp 208 is low, it pulls input terminal 230 of NOR gate 228 and input terminal 242 of NOR gate 236 low. Output terminal 245 of NOR gate 228 goes from low to high, causing input terminal 246 of NAND gate 250 to go high. However, input terminal 248 of NAND gate 250 is low since fieldmeter 26 is in the 10 kV range. Therefore, output terminal 252 of NAND gate 250 remains high and transistor 298 remains biased off. Over-range LED 42 therefore is not illuminated.

When input terminal 242 of NOR gate 236 goes low, output terminal 244 of NOR gate 236 goes high, since input terminal 240 of NOR gate 236 is already low, as discussed previously. This pulls input terminal 292 of NOR gate 290 high, which, in turn, causes output terminal 294 of NOR gate 290 to go low. The flip-flop formed from NOR gates 280, 290 changes state and output terminal 286 ($\overline{A}$) of NOR gate 280 goes high and output terminal 294 (A) of NOR gate 290 goes low. This causes pins 4, 5 of switch 118 to close and pins 2, 3 of switch 118 to open, switching fieldmeter 26 into the 50 kV range. Pins 12, 13 of switch 118 close and pins 10, 11 of switch 118 open, thereby changing the position of the decimal point on digital display 34. High output terminal 286 of NOR gate 280 biases transistor 356 on, thereby illuminating long range indicator LED 40. Low output terminal 294 of NOR gate 290 biases transistor 362 off, turning short range indicator LED 38 off.

When output terminal 274 of NAND gate 268 goes from low to high, which occurs when an under-range condition is detected, diode 276 conducts and generates a pulse. On the other hand, when the output terminal 244 of NOR gate 236 goes from low to high, which occurs when fieldmeter 26 is in the 10 kV range and an over-range condition is detected, diode 278 conducts and produces a pulse. In either case, the pulse is applied to the cathode of diode 300 and charges capacitor 304. Until capacitor 304 discharges through resistor 306, audible alarm 96 will sound and the appropriate distance indicator LED 38, 40 will blink.

Applying a pulse to the cathode of diode 300 charges capacitor 304, which brings + input terminal 308 of op amp 312 high. A high signal is generated at output terminal 314 of op amp 312 and applied to the cathode of diode 316. This decouples − input terminal 318 of op amp 322 from ground and pulser (beeper) circuit 84 is energized. Op amp 322 is configured as an oscillator so that when negative input terminal 318 is decoupled from ground, it oscillates at a rate of approximately 8 Hz. This causes the appropriate LED 38, 40 to blink at a rate of approximately 8 Hz.

Each time output terminal 324 of op amp 322 goes low, − input terminal 336 of op amp 340 floats, which permits op amp 340 to oscillate at a rate of approximately 2 KHz. This provides the drive frequency signal for audible alarm 96. When the output terminal 324 of op amp 322 goes high, a positive signal is applied to − input terminal 336 of op amp 340 which forces op amp 340 into a quiescent state.

Referring to switch 30, when it is moved to the LOCK position, contacts 181 close and couple input terminal 262 of NAND gate 260 and input terminal 242 of NOR gate 236 to ground. This locks the fieldmeter 26 in the 50 kV range. This permits measurements to be made of charged objects, such as moving plastic webs, which produce widely varying electrostatic fields.

Although the invention has been described in detail with reference to certain preferred embodiments and specific examples, variations and modifications exist within the scope and spirit of the invention as described and as defined in the following claims.

What is claimed is:

1. An apparatus for measuring electrostatic fields and related parameters such as electrostatic potential, voltage and charge density of objects in a non-contact manner, the apparatus comprising a sensor for sensing the electrostatic field produced by a charged object and for producing an electrical signal in response thereto, display means responsive to the electrical signal for providing a visual indication of the charge on the object, means for coupling the display means to the sensor, the display means having a first range for use in measurement by the sensor at a first distance from the object and a second range for use in measurement by the sensor at a second distance from the object, the means for coupling the display means to the sensor including means for scaling the electrical signal, first indicating means for providing an indication that the sensor is to be placed at the first distance from the charged object, second indicating means for providing an indication that the sensor is to be placed at the second distance from the charged object, a comparator, logic, means for coupling the comparator to the sensor, means for coupling the logic to the comparator, and means for coupling the means for scaling the electrical signal, the first indicating means and the second indicating means to the logic.

2. The apparatus of claim 1 wherein the means for coupling the comparator to the sensor comprises an absolute value circuit.

3. The apparatus of claim 2 wherein the means for coupling the comparator to the sensor further comprises the means for scaling the electrical signal, the absolute value circuit coupling the means for scaling the electrical signal to the comparator.

4. The apparatus of claim 1 and further comprising third indicating means for providing an indication that the sensor is to be moved from its current distance from the charged object, and means for coupling the third indicating means to the logic.

5. An apparatus for measuring electrostatic fields and related parameters such as electrostatic potential, voltage and charge density of objects in a non-contact manner, comprising a sensor for sensing the electrostatic field produced by a charged object and for producing an electrical signal in response thereto, display means responsive to the electrical signal produced by the sensor for providing a visual readout of the charge on the object, the display means having a lower range for use in measuring electrostatic field at first or initial distance to the object and a higher range for use in measuring electrostatic field at a second distance to the object, means for coupling the sensor to the display means including means for scaling the electrical signal produced by the sensor, first indicating means for indicating the first distance from the charged object at which charge should be initially measured, first logic means responsive to the signal produced when the apparatus is turned on for selecting the initial measuring distance, second indicating means for indicating the second distance, other than initial distance, from the charged object at which the charge should be measured, second logic means responsive to the signal produced by the sensor with apparatus at the initial measuring distance for selecting a scaling of the sensor is signal by the scaling means and for causing the first or second indicating means to indicate a distance from the charged object that the charge should be measured and for display means to display the lower or higher range, means for coupling the second logic means to the sensor, and means for coupling the first and second logic means to the first and second indicating means.

* * * * *